United States Patent
Li et al.

(10) Patent No.: US 11,869,910 B1
(45) Date of Patent: Jan. 9, 2024

(54) LIGHT SENSING ELEMENT

(71) Applicant: VisEra Technologies Company Ltd., Hsin-Chu (TW)

(72) Inventors: Ching-Hua Li, Hsin-Chu (TW); Zong-Ru Tu, Hsin-Chu (TW); Po-Hsiang Wang, Hsin-Chu (TW); Han-Lin Wu, Hsin-Chu (TW)

(73) Assignee: VisEra Technologies Company Ltd., Hsin-Chu (TW)

( * ) Notice: Subject to any disclaimer, the term of this patent is extended or adjusted under 35 U.S.C. 154(b) by 0 days.

(21) Appl. No.: 18/193,152

(22) Filed: Mar. 30, 2023

(51) Int. Cl.
*H01L 27/146* (2006.01)

(52) U.S. Cl.
CPC .... *H01L 27/14621* (2013.01); *H01L 27/1463* (2013.01); *H01L 27/14627* (2013.01); *H01L 27/14645* (2013.01)

(58) Field of Classification Search
CPC ......... H01L 27/14621; H01L 27/14627; H01L 27/1463; H01L 27/14645
See application file for complete search history.

(56) References Cited

U.S. PATENT DOCUMENTS

| 8,816,457 B2* | 8/2014 | Hung | H01L 27/14621 257/431 |
| 2012/0140100 A1* | 6/2012 | Shibazaki | H01L 27/14623 348/E9.005 |

* cited by examiner

*Primary Examiner* — Seung C Sohn
(74) *Attorney, Agent, or Firm* — LIU & LIU

(57) ABSTRACT

The present disclosure provides a light sensing element including a unit. The unit includes a plurality of photodiodes, a color filter disposed above the photodiodes, and a light host embedded in the color filter. The light host is a hollow structure disposed above the photodiodes. The color filter includes a first portion surrounding the light host, a second portion surrounded by the light host, and a third portion covering and physically contacting the first portion, the light host, and the second portion.

20 Claims, 18 Drawing Sheets

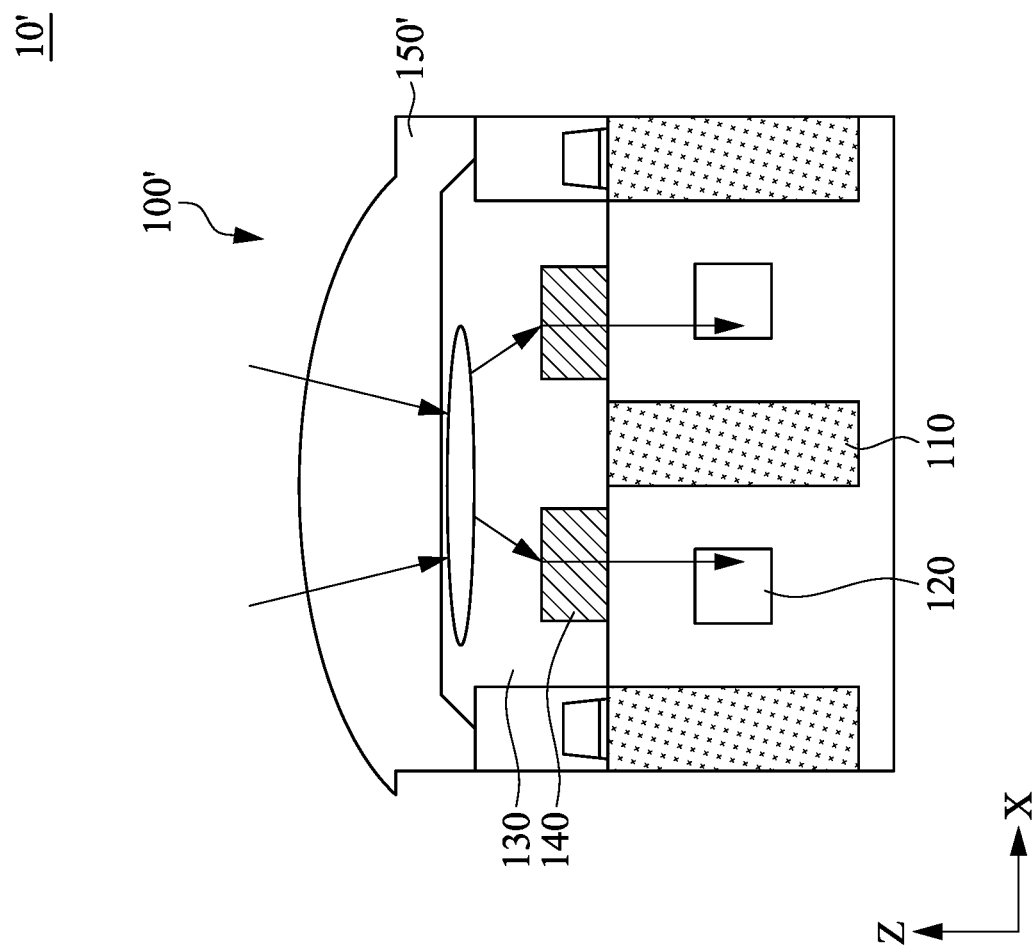

LIGHT SENSING ELEMENT

BACKGROUND

Field of Invention

The present disclosure relates to the light sensing element. More particularly, the present disclosure relates to the pixel components of the light sensing element.

Description of Related Art

A light sensing element generally includes a plurality of pixels with photodiodes therein to detect the incident light. When the incident light passes through the layers above the photodiodes, the incident light may be refracted by the layers and strayed from the expected path. This makes the photodiodes to receive the imprecise amount of the light, which causes the deviation of the light sensing result. Therefore, the light distribution correction is important for improving the light sensing accuracy.

SUMMARY

According to some embodiments of the present disclosure, a light sensing element includes a plurality of first units. Each of the plurality of the first units includes a plurality of first photodiodes, a first color filter disposed above the first photodiodes, and a first light host embedded in the first color filter. The first light host is a hollow structure disposed above the plurality of the first photodiodes. The first color filter includes a first portion surrounding the first light host, a second portion surrounded by the first light host, and a third portion covering and physically contacting the first portion, the first light host, and the second portion.

In some embodiments, a refractive index of the first light host is higher than that of the color filter, and the refractive index of the first light host is in a range of 1.8 to 2.5.

In some embodiments, a maximum height of the first light host is in a range of 100 nm to 900 nm.

In some embodiments, a maximum width of the first light host is in a range of 50 nm to 500 nm.

In some embodiments, a difference between a top width and a bottom width of the first light host is smaller than or equal to 500 nm.

In some embodiments, an inner gap between inner sidewalls of the first light host is in a range of 100 nm to 500 nm.

In some embodiments, the second portion of the first color filter has a circle shape, a square shape, a hexagon shape, or an octagon shape in a plan view, and wherein the first light host conformally surrounds the second portion.

In some embodiments, the first light host has a square cross-section, a rectangle cross-section, a triangle cross-section, or a trapezoid cross-section.

In some embodiments, each of the plurality of the first units further includes a deep trench isolation structure separating the plurality of the first photodiodes, in which the deep trench isolation structure includes a first deep trench isolation portion extending through a center of the first unit and a second deep trench isolation portion extending along an edge of the first unit. A pixel size is defined as a distance between a center line of the first deep trench isolation portion and a center line of the second deep trench isolation portion, and a maximum width of the first light host is smaller than or equal to ½ of the pixel size.

In some embodiments, an inner gap between inner sidewalls of the first light host is smaller than or equal to ½ of the pixel size.

In some embodiments, the first light host is symmetric distributed relative to a center of the first unit.

In some embodiments, the light sensing element further includes a second unit adjacent to one of the plurality of the first units. The second unit includes a plurality of second photodiodes and a second color filter disposed above the second photodiodes.

In some embodiments, the light sensing element further includes a second light host embedded in the second color filter, in which the second light host is a hollow structure disposed above the plurality of the second photodiodes. The second color filter includes a fourth portion surrounding the second light host, a fifth portion surrounded by the second light host, and a sixth portion covering and physically contacting the fourth portion, the second light host, and the fifth portion.

In some embodiments, the first light host has a first maximum height, the second light host has a second maximum height, and a difference between the second maximum height and the first maximum height is smaller than or equal to 400 nm.

In some embodiments, the first light host has a first maximum width, the second light host has a second maximum width, and a difference between the second maximum width and the first maximum width is smaller than or equal to 200 nm.

In some embodiments, the first light host has a first inner gap, the second light host has a second inner gap, and a difference between the second inner gap and the first inner gap is smaller than or equal to 200 nm.

In some embodiments, the light sensing element further includes a third unit adjacent to the one of the plurality of the first units, and a fourth unit adjacent to the third unit and the second unit. Any adjacent two of the first unit, the second unit, the third unit, and the fourth unit have different color filters.

In some embodiments, the plurality of the first units are disposed in one of four regions of the light sensing element, the plurality of the first units are arranged as a two-dimensional array with n columns and n rows, and n is an integer. Any adjacent two of the four regions have different color filters.

In some embodiments, the plurality of the first photodiodes are arranged in a 2×2 array.

In some embodiments, the light sensing element further includes a lens above the first color filter, in which a center of the lens is offset from a center of one of the plurality of the first units.

According to the above-mentioned embodiments, the light sensing element includes the light host in the unit, where the light host redistributes the incident light to the photodiodes below. Since the light host is a hollow structure above the photodiodes, the light host can uniformly redistribute the light to the photodiodes in the unit. This provides a balanced light distribution in one unit and improves the accuracy of the light sensing element.

It is to be understood that both the foregoing general description and the following detailed description are by examples and are intended to provide further explanation of the disclosure as claimed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4A and 4B illustrate the cross-sectional views of the light sensing elements according to some embodiments of the present disclosure.

DETAILED DESCRIPTION

Figure 1A:
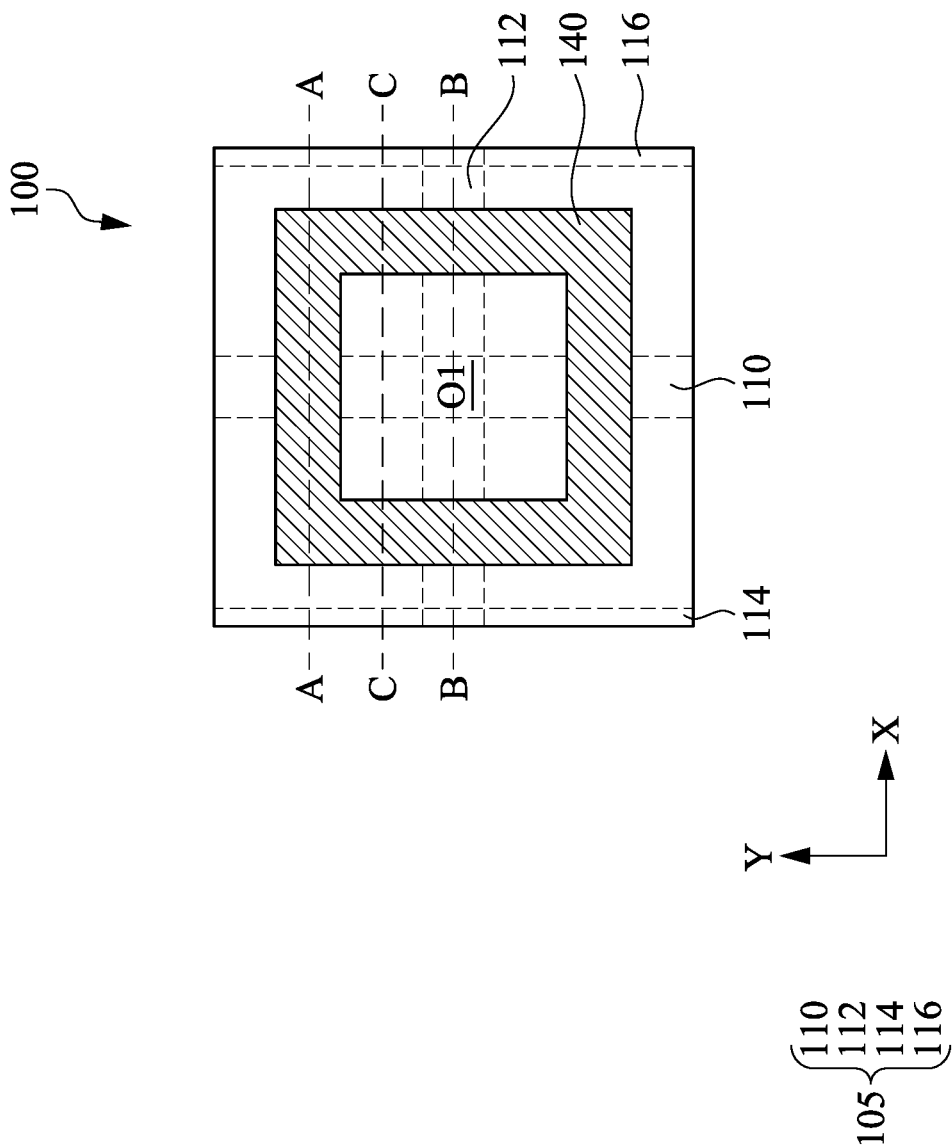
FIG. 1A illustrates a top scheme view of a light sensing element according to one embodiment of the present disclosure.

The following disclosure provides many different embodiments, or examples, for implementing different features of the provided subject matter. Specific examples of components, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a light sensing element including a unit with a plurality of photodiodes and a light host. The light host is a hollow structure above the photodiodes, so that the light host uniformly redistributes the light to each of the photodiodes in the unit. This provides a balanced light distribution in one unit and improves the accuracy of the light sensing element.

Figure 1B:
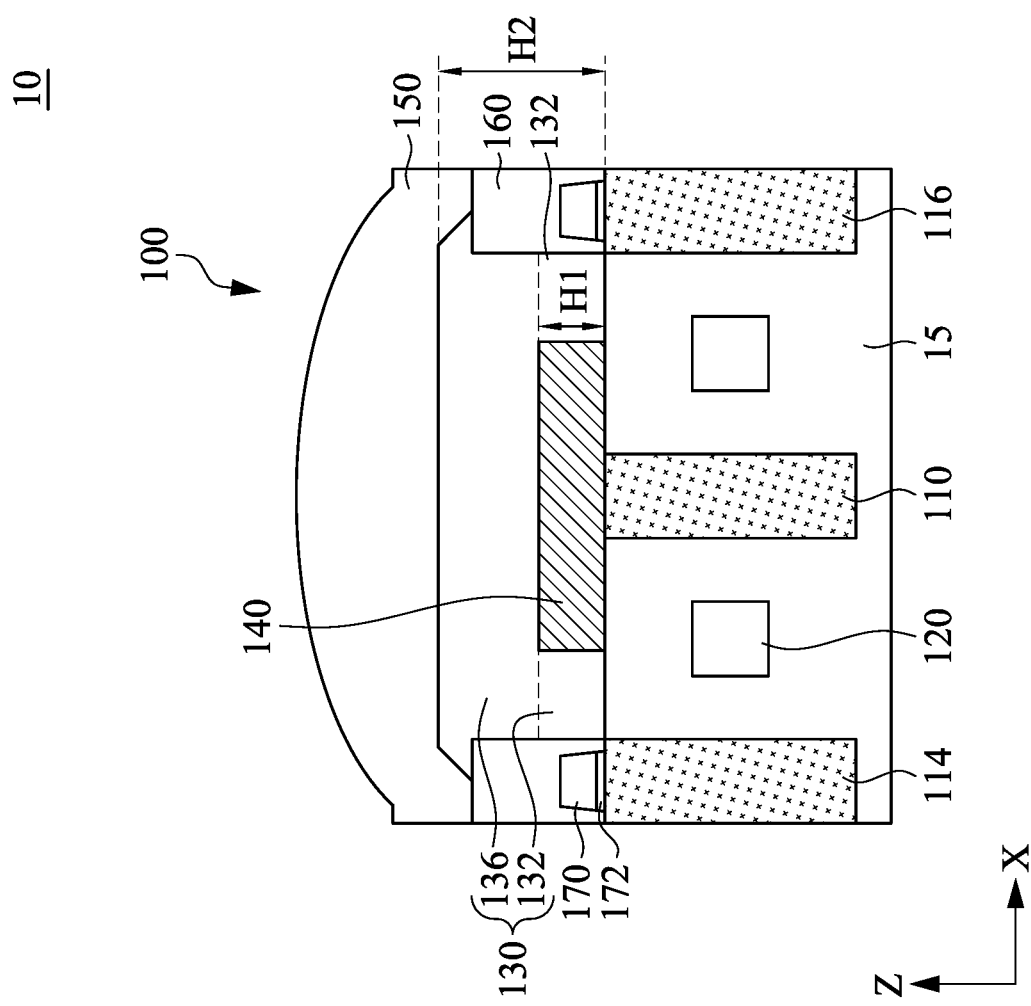
FIGS. 1B and 1C illustrate the cross-sectional views of the light sensing element in FIG. 1A.
Figure 1C:
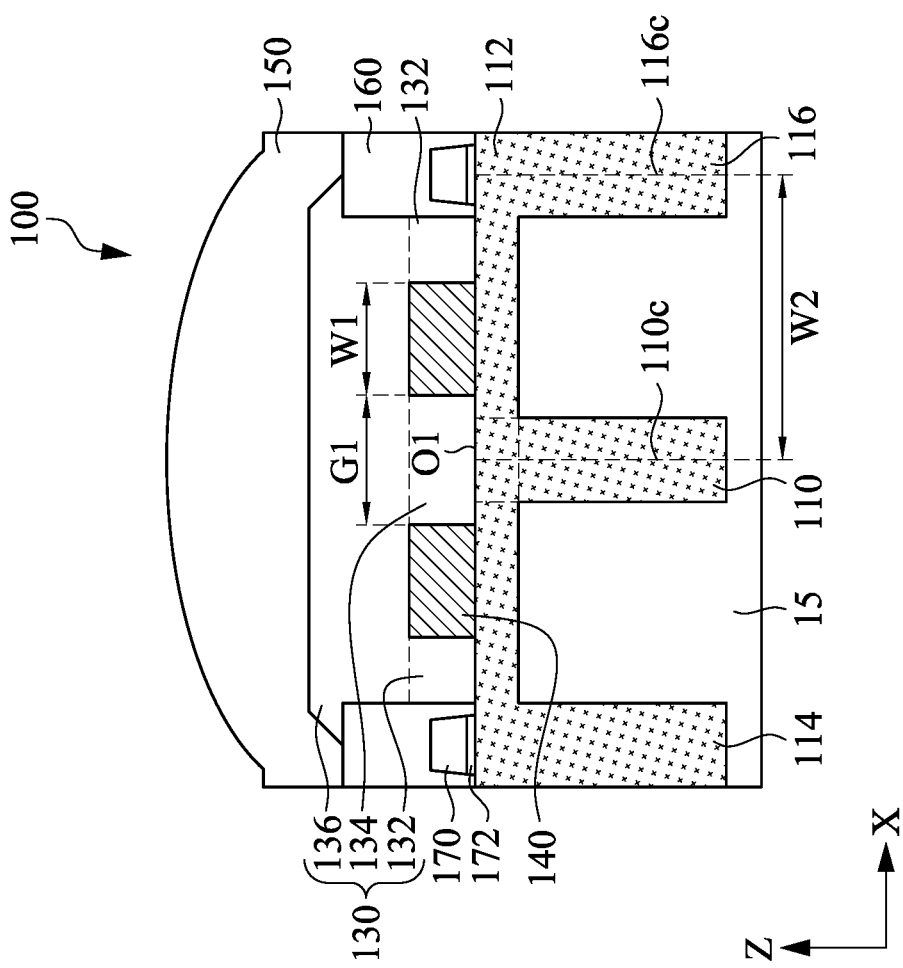

According to one embodiment of the present disclosure, FIG. 1A illustrates a top scheme view of a light sensing element 10. FIG. 1B illustrates a cross-sectional view of the light sensing element 10 taken along line A-A in FIG. 1A. FIG. 1C illustrates a cross-sectional view of the light sensing element 10 taken along line B-B in FIG. 1A. Referring to FIGS. 1A to 1C, the light sensing element 10 includes a unit 100. The unit 100 includes a substrate 15, a deep trench isolation structure 105, a plurality of photodiodes 120, a color filter 130, and a light host 140.

Specifically, the deep trench isolation structure 105 is disposed in the substrate 15. In the top view shown in FIG. 1A, the deep trench isolation structure 105 includes a deep trench isolation portion 110 extending in the Y-axis direction and a deep trench isolation portion 112 extending in the X-axis direction. The deep trench isolation portions 110 and 112 intersect in the substrate 15, which form an intersection point O1. As used herein, the intersection point O1 is referred as the center of the unit 100. In other words, the deep trench isolation portions 110 and 112 extend through the center of the unit 100.

In some embodiments, the unit 100 may include more than two deep trench isolation portions in the substrate 15. For example, in the top view shown in FIG. 1A, the deep trench isolation structure 105 may include additional deep trench isolation portions 114 and 116 extending along the edge of the unit 100 in the Y-axis direction. The deep trench isolation portions 114 and 116 may be positioned on opposite sides of the deep trench isolation portion 110 and intersect with the deep trench isolation portion 112. In some embodiments, the deep trench isolation structure 105 may form a grid shape including the deep trench isolation portions extending through the center of the unit 100 (such as the deep trench isolation portions 110 and 112) and the deep trench isolation portions extending along the edge of the unit 100 (such as the deep trench isolation portions 114 and 116) in the plan view of the unit 100.

The photodiodes 120 are disposed in the substrate 15. The photodiodes 120 are separated by the deep trench isolation structure 105 so that the photodiodes 120 are distanced from each other. As illustrated in FIGS. 1A to 1C, the separated photodiodes 120 may be arranged in a 2×2 array. In some embodiments, the depth of the photodiodes 120 from the top surface of the substrate 15 may be deeper than the top surface of the deep trench isolation structure 105. In some other embodiments, the top surface of the photodiode 120 may be level with the top surface of the deep trench isolation structure 105.

The color filter 130 is on the top surfaces of the substrate 15 and the deep trench isolation structure 105. The color filter 130 is disposed above all the photodiodes 120 of the unit 100. The incident light passes through the color filter 130 before reaching the photodiodes 120. Therefore, the incident light is first filtered by the color filter 130 to provide specific wavelength of the incident light for the photodiodes 120.

The light host 140 is disposed in the color filter 130, which the light host 140 surrounds and is surrounded by the color filter 130. Specifically, as shown in FIGS. 1A to 1C, the light host 140 is a hollow structure disposed above the photodiodes 120 and embedded in the color filter 130. As a result, the color filter 130 may include a first portion 132 surrounding the light host 140, a second portion 134 surrounded by the light host 140, and a third portion 136 covering and physically contacting the first portion 132, the second portion 134, and the light host 140. Since the light host 140 is a hollow structure above the photodiodes 120, the light host 140 may uniformly redistribute the incident light to the photodiodes 120 in the unit 100 to provide a balanced light distribution.

More specifically, a center of symmetry of the light host 140 is aligned with the center of the unit 100 in the plan view. For example, as shown in FIG. 1A, the light host 140 is a hollow square with a center aligned with the intersection point O1. As a result, the light host 140 is symmetric distributed relative to the center of the unit 100. This allows the light host 140 to uniformly direct the incident light to the photodiodes 120 separated by the deep trench isolation structure 105. The light directing function of the light host 140 would be further discussed in detail referring to FIGS. 2 and 3.

In some embodiments, the light host 140 may be made of the material which has a refractive index higher than that of the color filter 130. For example, the light host 140 may be made of the material with the refractive index in a range of 1.8 to 2.5, such as SiN. The light host 140 having the refractive index higher than the color filter 130 may uniformly direct the incident light to the photodiodes 120 after the incident light enters the color filter 130. In other words, the refractive index difference between the light host 140 and the color filter 130 improves the light distribution uniformity in the unit 100.

In some embodiments, as shown in FIG. 1B, the maximum height H1 of the light host 140 in the direction of the Z-axis may be smaller than or equal to the maximum height H2 of the color filter 130, so that the entire light host 140 is disposed in the color filter 130. This allows the incident light to be first filtered by the color filter 130 and then directed by the light host 140. For example, the maximum height H1 of the light host 140 may be in a range of 100 nm to 900 nm.

In some embodiments, as shown in FIG. 1C, the maximum width W1 of the light host 140 in the direction of the X-axis may be smaller than or equal to ½ of a pixel size, where the pixel size is herein defined as the distance W2 between center lines of the adjacent deep trench isolation portions 110 and 116. For example, the maximum width W1 of the light host 140 may be in a range of 50 nm to 500 nm. Similarly, the inner gap G1 between the inner sidewalls of the light host 140 in the direction of the X-axis may be smaller than or equal to ½ of the pixel size. For example, the inner gap G1 of the light host 140 may be in a range of 100 nm to 500 nm.

The maximum width W1 and the inner gap G1 of the light host 140 may affect the channel imbalance of the unit 100, where the channel imbalance is herein defined as a ratio of the strongest light magnitude and the weakest light magnitude measured in one unit 100. When the maximum width W1 and the inner gap G1 of the light host 140 is in the above-mentioned range, the channel imbalance may be reduced to a value near 1.0 which indicates that the incident light is uniformly distributed over the unit 100. If the maximum width W1 is smaller than 50 nm or the inner gap G1 is larger than ½ of the pixel size, the light host 140 may be too thin to uniformly direct the incident light to the photodiodes 120 in unit 100, leading to high channel imbalance. If the maximum width W1 is larger than ½ of the pixel size or the inner gap G1 is smaller than 100 nm, the light host 140 may lower the quantum efficiency (QE) of the unit 100 or may cause the light cross-talk between the photodiodes 120.

In some embodiments, the light sensing element 10 may include a lens 150 above the color filter 130. The lens 150 may focus the incident light into the color filter 130 to improve the sensitivity of the unit 100. In some embodiments, the light sensing element 10 may include an insulation layer 160 around the color filter 130 to isolate the unit 100 from other units (for example, referring to FIGS. 6A to 6C). The insulation layer 160 may further include a metal grid 170 and a dielectric layer 172 between the metal grid 170 and the substrate 15 to reflect the incident light. The metal grid 170 may avoid the incident light from entering the deep trench isolation portions 114 and 116, thereby reducing the risk of light cross-talk between the unit 100 and the additional unit nearby. It should be noted that the light sensing element 10 is simplified for illustration clarity. The light sensing element 10 may include additional components, and these variations are contemplated in the present disclosure.

Figure 2:
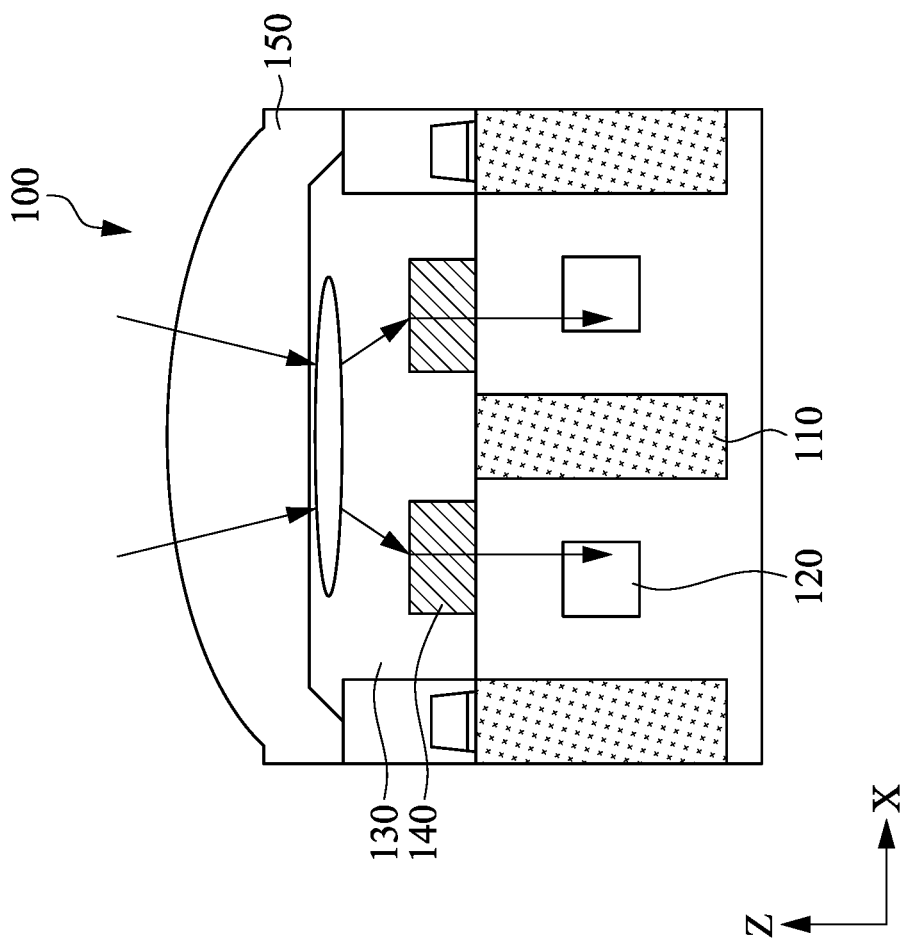

To illustrate the light directing function of the light host 140, FIG. 2 illustrates a cross-sectional view of the light sensing element 10 taken along line C-C in FIG. 1A according to one embodiment of the present disclosure. The incident light paths are shown as arrows pointing from outside into the unit 100. As shown in FIG. 2, the incident light is first focused by the lens 150 to gather the light into the color filter 130. Since the refractive index of the light host 140 is higher than that of the color filter 130, the light in the color filter 130 is then refracted into the light host 140. The light passes through the light host 140 and reaches the photodiodes 120 below. As the hollow structure of the light host 140 is disposed above the photodiodes 120 in the unit 100, the refracted light is uniformly directed to all of the photodiodes 120. In other words, the light host 140 provides the uniform incident light distribution in the unit 100 and improves the accuracy of the light sensing element 10.

It should be noted that the light host 140 may uniformly direct the incident light to the photodiodes 120 of the unit 100 even if the photodiodes 120 are not aligned with the light host 140 along the Z-axis. More specifically, the light host 140 is symmetric distributed relative to the center of the unit 100, so that the orthogonal projection of the light host 140 is uniformly distributed onto the sections of the substrate 15 separated by the deep trench isolation structure 105. Since the light amount passed by the light host 140 depends on the orthogonal projection of the light host 140, the incident light may be uniformly distributed into the sections of the substrate 15 and the photodiodes 120 therein. Therefore, even if the center of the photodiode 120 is not aligned with the light host 140 along the Z-axis, the light host 140 still evenly distributes the incident light energy to the photodiodes 120 in the unit 100. In addition, compared to the formation of the light host 140 that is directly aligned with the photodiodes 120, forming the light host 140 with the hollow structure symmetric distributed relative to the center of the unit 100 is easier to achieve in the manufacturing process.

According to another embodiment of the present disclosure, FIG. 3 illustrates a cross-sectional view of the light sensing element 10'. The light sensing element 10' is similar to the light sensing element 10 in FIG. 2, except for the lens 150' of the light sensing element 10'. As shown in FIG. 3, the lens 150' is left deviated from the expected position so that a center of the lens 150' is offset from the center of the unit 100' (see the intersection point O1 in FIG. 1A). After the incident light is focused by the lens 150', the incident light in the color filter 130 would also be left deviated from the center of the color filter 130. However, before the incident light reach the photodiodes 120, the incident light is refracted into the light host 140. Since the light host 140 is a hollow structure above the photodiodes 120, the light may be uniformly redistributed to the photodiodes 120 by the light host 140. This improves the light distribution uniformity of the unit 100' and increases the accuracy of the light sensing element 10'.

Figure 4A:
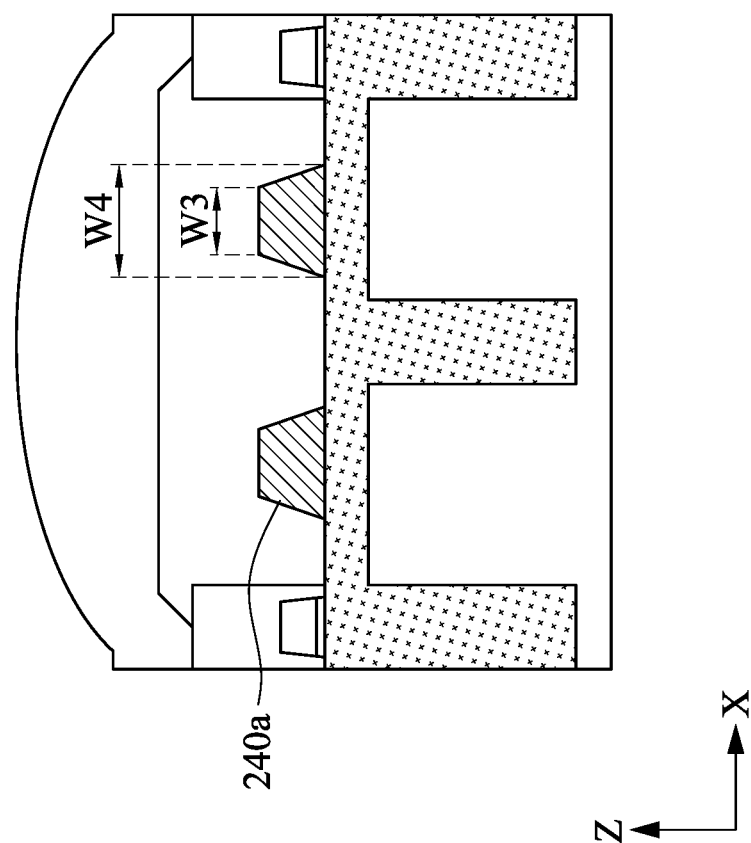
Figure 4B:
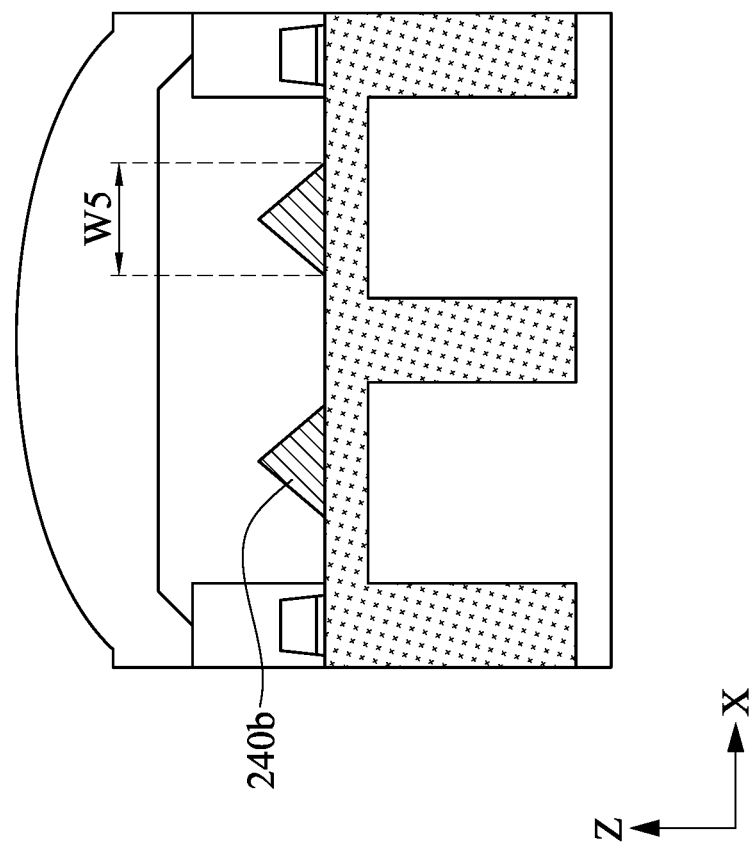

In some embodiments, a top width and a bottom width of the light host 140 may be the same, so that the light host 140 has a square cross-section or a rectangle cross-section. Referring to FIG. 1C, the light host 140 sandwiched by the first portion 132 and the second portion 134 has a rectangle cross-section. In some other embodiments, the top width and the bottom width of the light host 140 may be different, and the difference between the top width and the bottom width may be smaller than or equal to ½ of the pixel size, such as 0.1 nm to 500 nm. According to some embodiments of the present disclosure, FIGS. 4A and 4B respectively illustrates the cross-sectional views of the light sensing elements 20a and 20b. The light sensing elements 20a and 20b are similar to the light sensing element 10, except for the shape of the light hosts 240a and 240b. As shown in FIG. 4A, the top width W3 of the light host 240a may be smaller than the bottom width W4 and also larger than zero, which forms the trapezoid cross-section of the light host 240a. As shown in FIG. 4B, the top width of the light host 240b may be zero and also smaller than the bottom width W5, which forms the triangle cross-section of the light host 240b. Other suitable shapes may be utilized for the light host and are contemplated in the present disclosure.

Figure 5C:
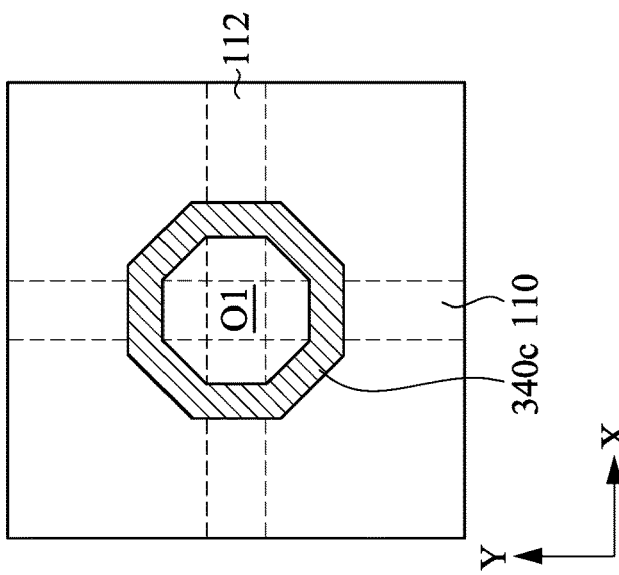
FIGS. 5A, 5B and 5C illustrate the top scheme views of the light sensing elements according to some embodiments of the present disclosure.
Figure 5B:
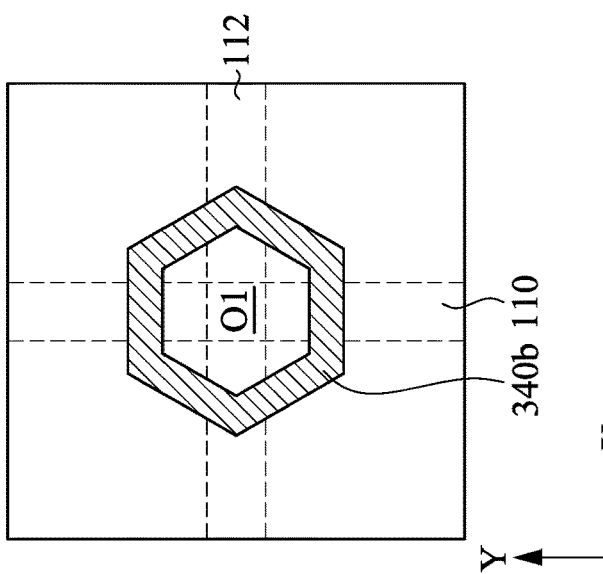
Figure 5A:
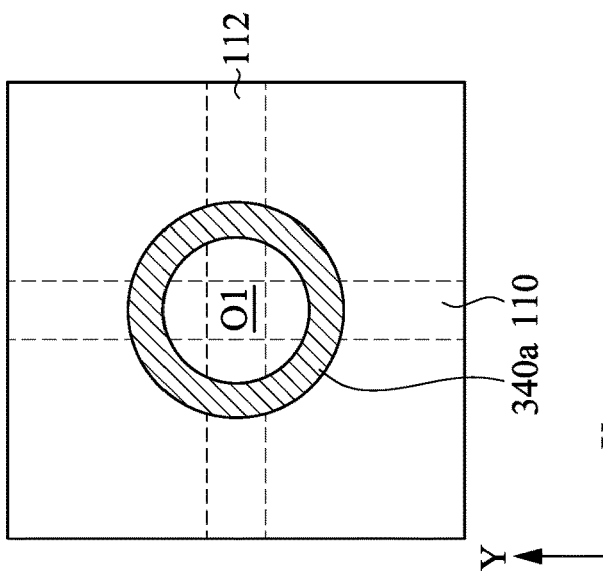

In some embodiments, as long as the light host 140 is symmetric distributed relative to the intersection point O1, the light host 140 may have a hollow shape in the plan view other than the hollow square shown in FIG. 1A. According to some embodiments of the present disclosure, FIGS. 5A to 5C illustrates the top scheme views of the light sensing elements 30a, 30b, and 30c, respectively. The light sensing elements 30a to 30c are similar to the light sensing element 10, except for the shape of the light hosts 340a, 340b, and 340c. As shown in FIG. 5A, the second portion of the color filter of the light sensing element 30a has a circle shape, so that the light host 340a conformally surrounding the second portion may have a hollow circle shape. As shown in FIG. 5B, the second portion of the color filter of the light sensing element 30b has a hexagon shape, so that the light host 340b conformally surrounding the second portion may have a hollow hexagon shape. As shown in FIG. 5C, the second portion of the color filter of the light sensing element 30c has a octagon shape, so that the light host 340c conformally surrounding the second portion may have a hollow octagon shape. Other suitable shapes may be utilized for the light host and are contemplated in the present disclosure.

Figure 6A:
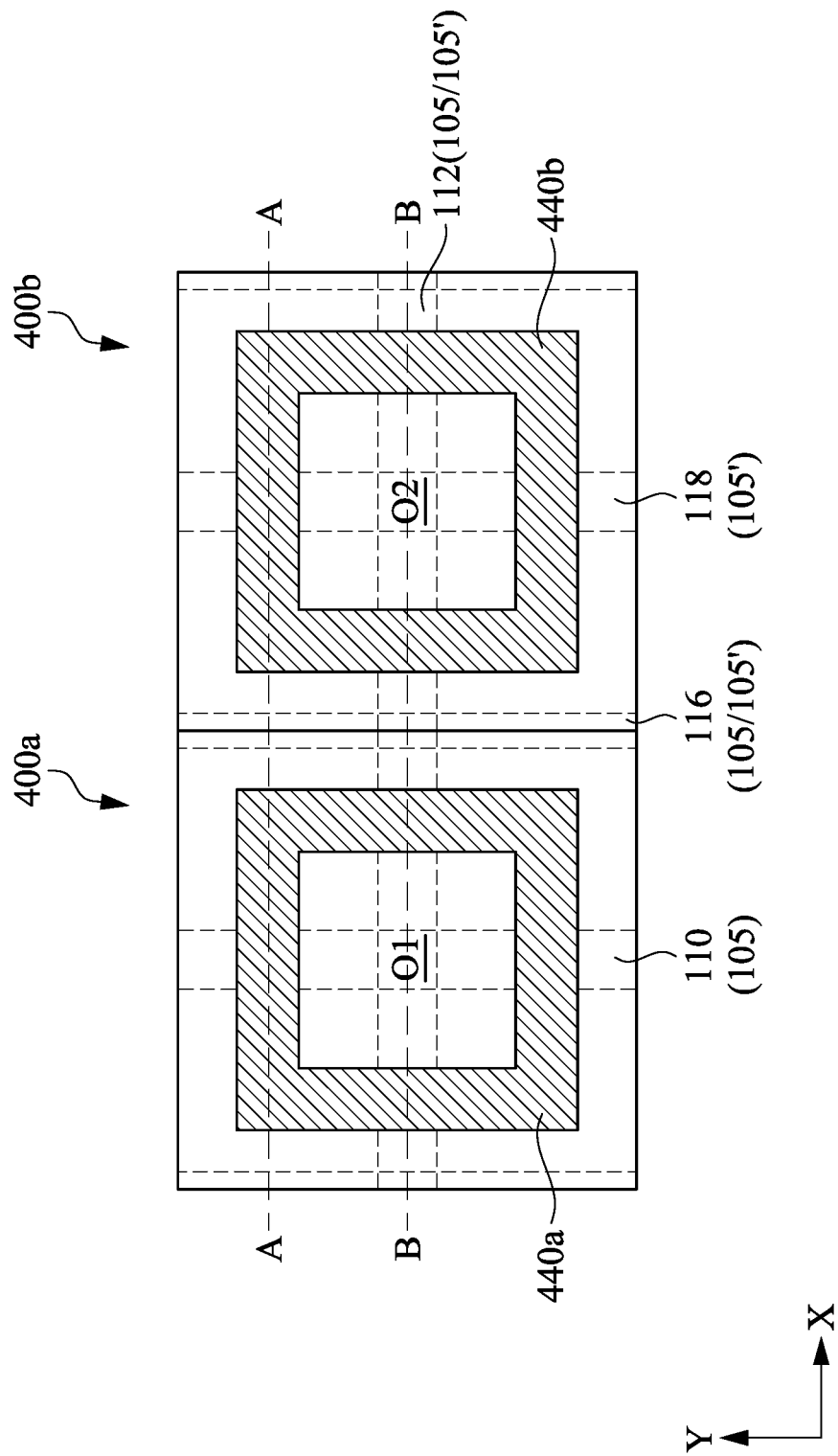
FIG. 6A illustrates a top scheme view of a light sensing element according to another embodiment of the present disclosure.
Figure 6B:
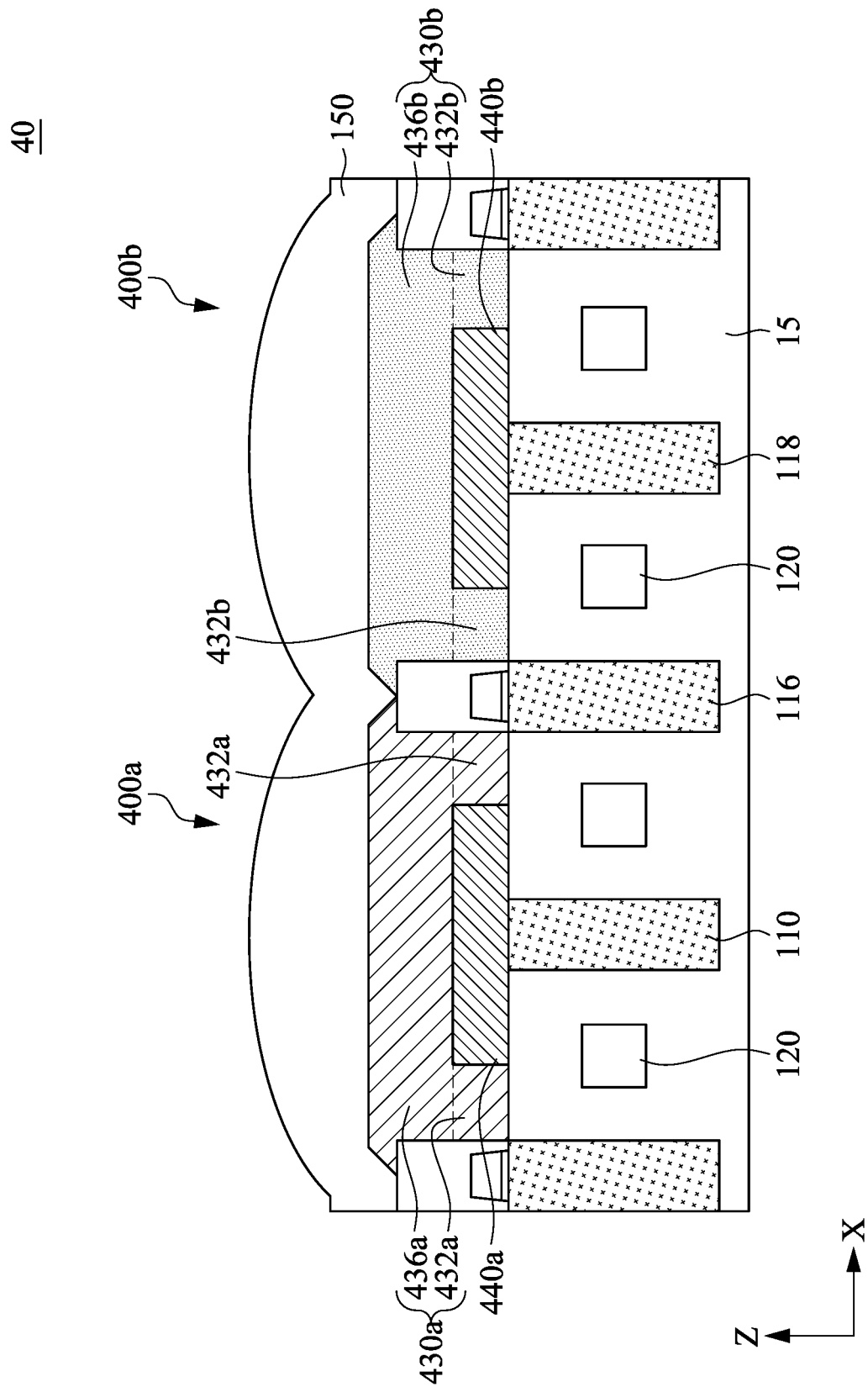
FIGS. 6B and 6C illustrate the cross-sectional views of the light sensing element in FIG. 6A.
Figure 6C:
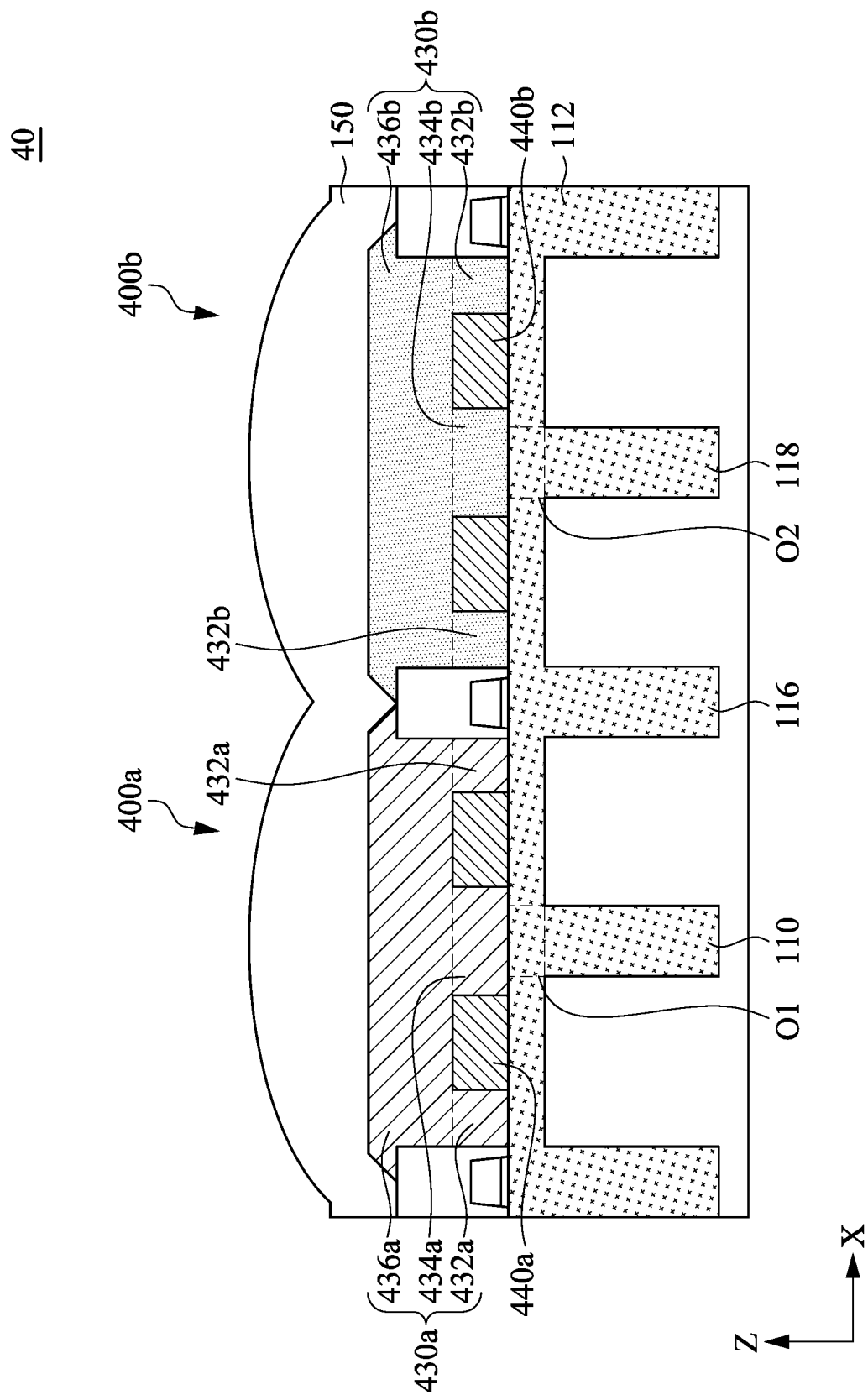

According to another embodiment of the present disclosure, FIG. 6A illustrates a top scheme view of the light sensing element 40. FIG. 6B illustrates a cross-sectional view of the light sensing element 40 taken along line A-A in FIG. 6A. FIG. 6C illustrates a cross-sectional view of the light sensing element 40 taken along line B-B in FIG. 6A. Referring to FIGS. 6A to 6C, the light sensing element 40 includes a first unit 400a and a second unit 400b adjacent to the first unit 400a.

Specifically, the first unit 400a is similar to the unit 100 in FIGS. 1A to 1C, including a deep trench isolation structure 105 in the substrate 15, photodiodes 120 in the substrate 15, a first color filter 430a on the substrate 15, a first light host 440a embedded in the first color filter 430a, and a lens 150 on the first color filter 430a. The first light host 440a is a hollow structure disposed above the photodiodes 120. The first color filter 430a includes a first portion 432a surrounding the first light host 440a, a second portion 434a surrounded by the first light host 440a, and a third portion 436a covering and physically contacting the first portion 432a, the second portion 434a, and the first light host 440a.

The second unit 400b is similar to the adjacent first unit 400a, including a deep trench isolation structure 105' in the substrate 15, photodiodes 120 in the substrate 15, a second color filter 430b on the substrate 15, a second light host 440b embedded in the second color filter 430b, and a lens 150 on the second color filter 430b. The deep trench isolation structure 105' includes the deep trench isolation portion 112 extending along the X-axis and a deep trench isolation portion 118 extending along the Y-axis. The intersected deep trench isolation portions 118 and 112 form an intersection point O2, which indicated the center of the second unit 400b. The second light host 440b is a hollow structure disposed above the photodiodes 120. The second color filter 430b includes a fourth portion 432b surrounding the second light host 440b, a fifth portion 434b surrounded by the second light host 440b, and a sixth portion 436b covering and physically contacting the fourth portion 432b, the fifth portion 434b, and the second light host 440b. The difference between the first unit 400a and the second unit 400b is the color filter type. Different wavelengths of the incident light transmit through the first color filter 430a and the second color filter 430b, so that the lights received by the photodiodes 120 in the two units are not the same.

In some embodiments, the deep trench isolation portion 112 in the second unit 400b may be extended from the first unit 400a. The deep trench isolation portion 116 between the first unit 400a and the second unit 400b may be shared by the deep trench isolation structure 105 and 105' as the deep trench isolation portion 116 isolates the first unit 400a from the second unit 400b. In some embodiments, the lens 150 in the second unit 400b may be extended from the first unit 400a, as shown in FIG. 6B.

Figure 7:
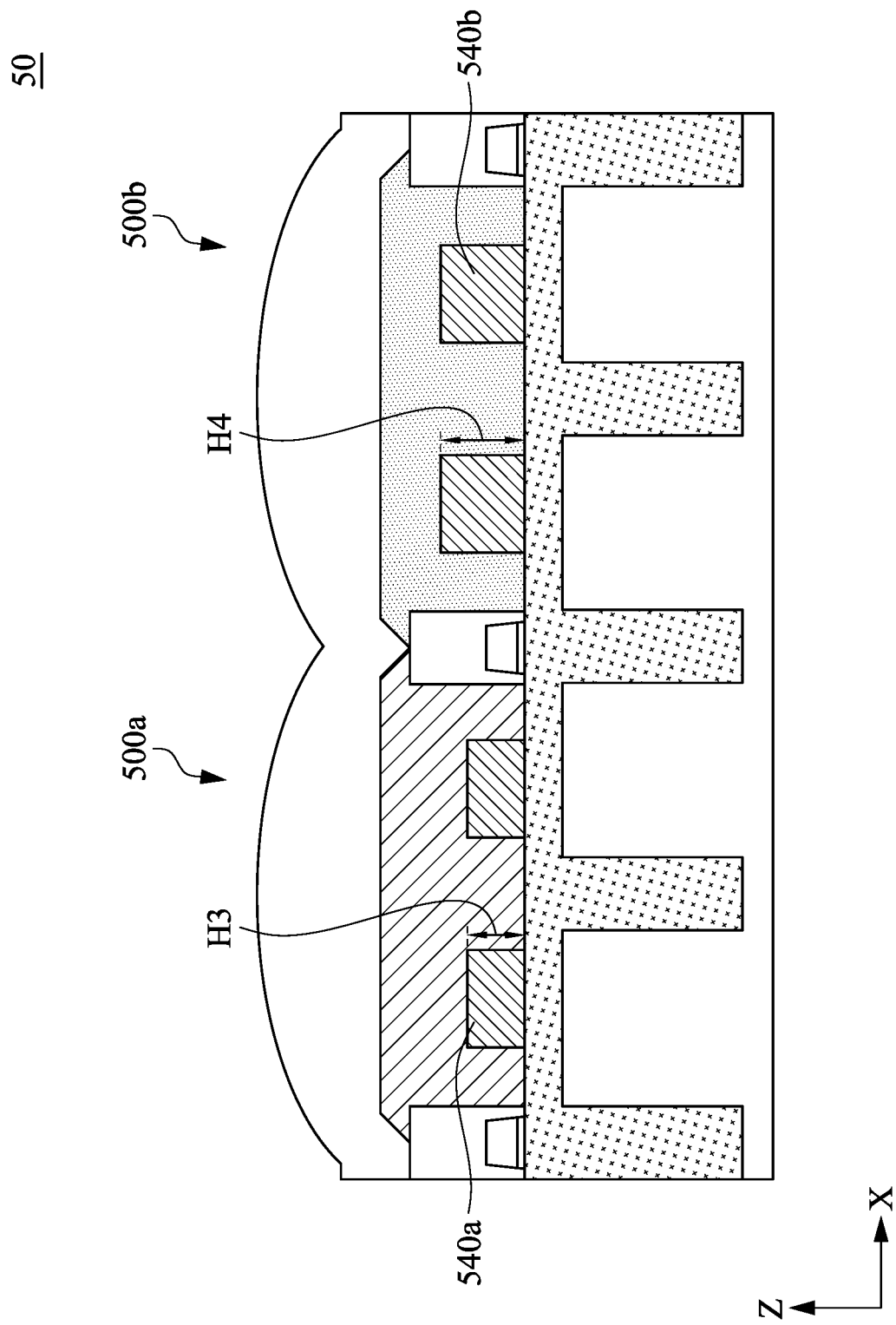
FIG. 7 illustrates a cross-sectional view of a light sensing element according to another embodiment of the present disclosure.

In some embodiments, the structure of first light host 440a may be the same as the second light host 440b, as shown in FIGS. 6A to 6C. In some other embodiments, the structure of the first light host 440a may be different from that of the second light host 440b. According to one embodiment of the present disclosure, FIG. 7 illustrates a cross-sectional view of a light sensing element 50. The light sensing element 50 is similar to the light sensing element 40 in FIG. 6C, except for the maximum heights of the first light host 540a and second light host 540b. As shown in FIG. 7, the first light host 540a has a maximum height H3 in the direction of the Z-axis smaller than a maximum height H4 of the second light host 540b. The difference between the maximum height H3 and the maximum height H4 may be smaller than or equal to 400 nm.

For example, the first unit 500a may be a blue unit while the second unit 500b may be a red unit, or vice versa. In this case, the maximum height difference between the first light host 540a and the second light host 540b may be in a range of 0 nm to 400 nm. For another example, the first unit 500a may be a green unit while the second unit 500b may be a red or blue unit. In this case, the maximum height H4 of the second light host 540b may be in a range of the maximum height H3±200 nm. Since the green light wavelength is larger than the blue light wavelength and smaller than the red light wavelength, the green unit may be used as the reference unit for the structure of the light hosts to minimize the deviation between the units.

Figure 8A:
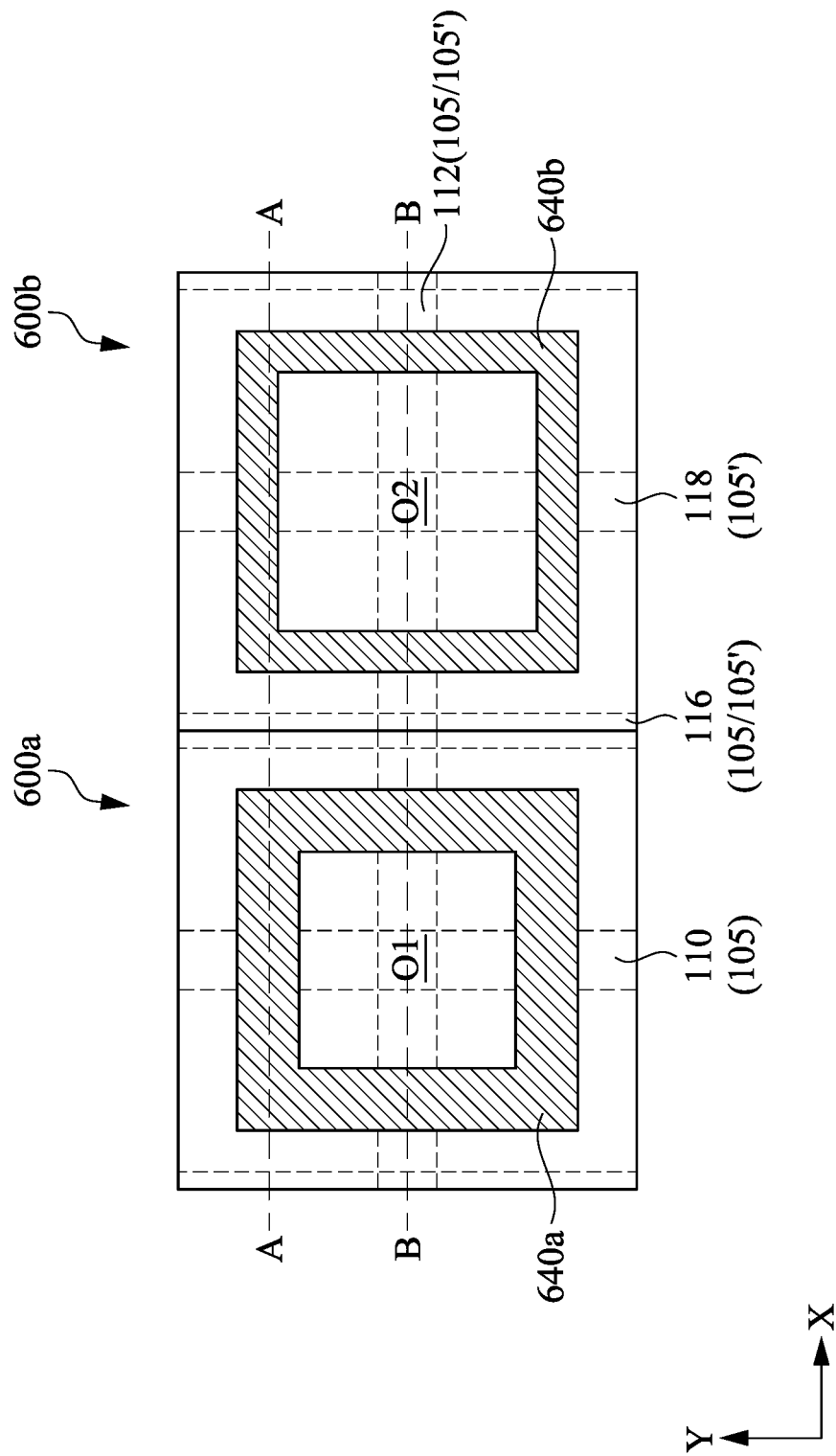
FIG. 8A illustrates a top scheme view of a light sensing element according to another embodiment of the present disclosure.
Figure 8B:
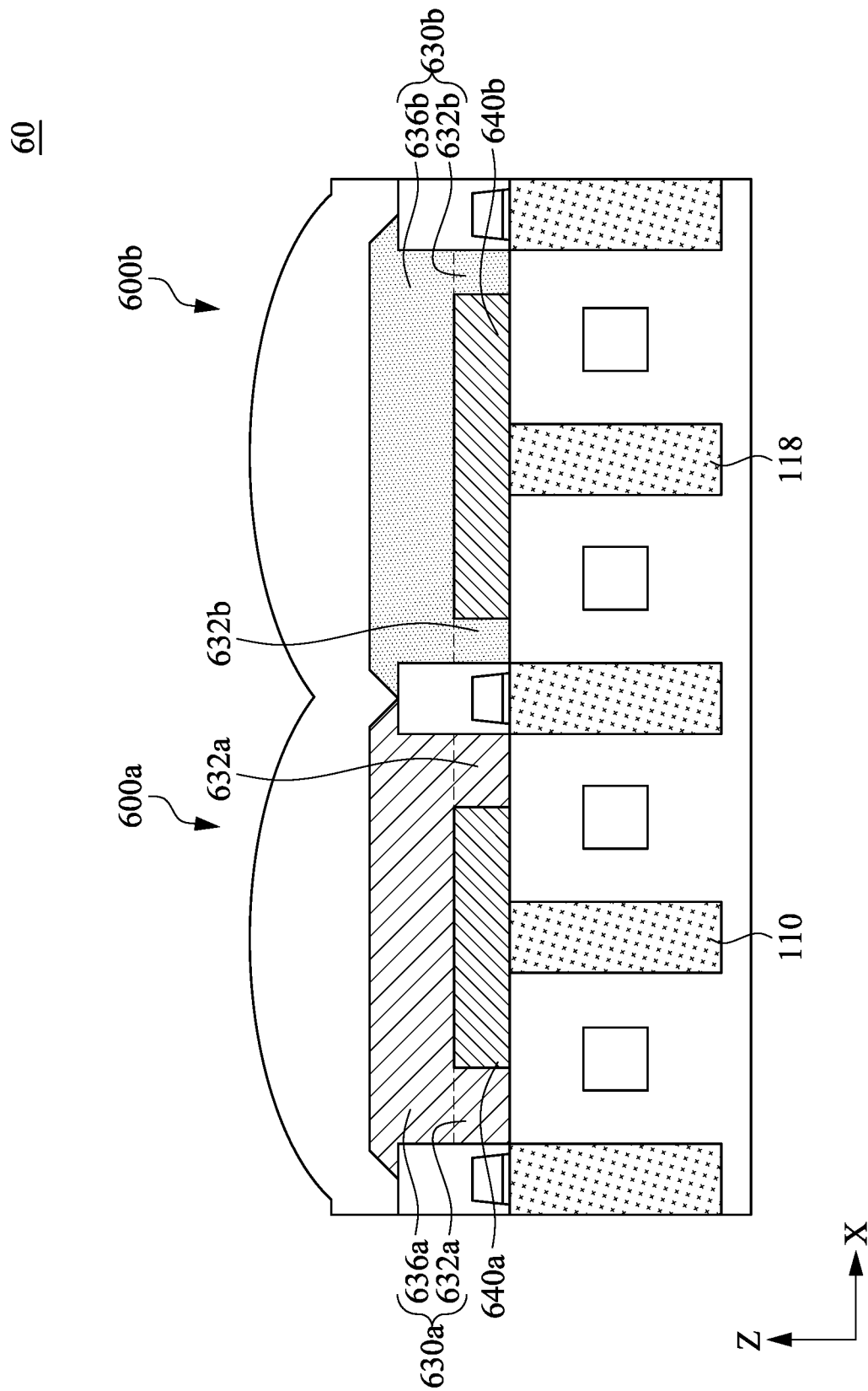
FIGS. 8B and 8C illustrate the cross-sectional views of the light sensing element in FIG. 8A.
Figure 8C:
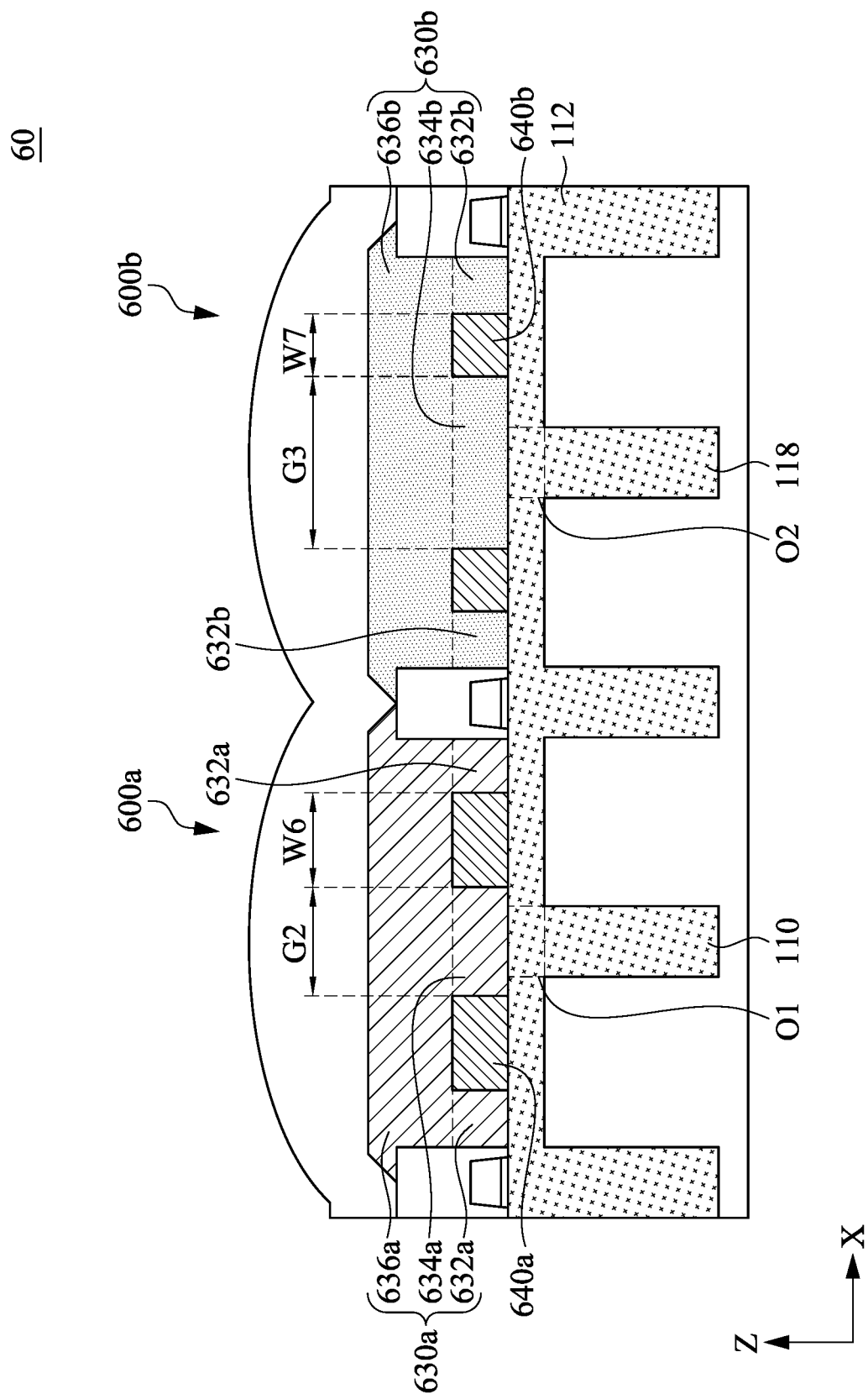

In addition to the maximum height difference, other structure parameters of the first light host 440a may be different from those of the second light host 440b. According to one embodiment of the present disclosure, FIG. 8A illustrates a top scheme view of the light sensing element 60. FIG. 8B illustrates a cross-sectional view of the light sensing element 60 taken along line A-A in FIG. 8A. FIG. 8C illustrates a cross-sectional view of the light sensing element 60 taken along line B-B in FIG. 8A. The light sensing element 60 is similar to the light sensing element 40 in FIGS. 6A to 6C, except for the shapes of the first light host 640a and second light host 640b. As shown in FIGS. 8A to 8C, the first light host 640a has a maximum width W6 in the direction of the X-axis larger than a maximum width W7 of the second light host 640b. The difference between the maximum width W6 and the maximum width W7 may be smaller than or equal to 200 nm. Correspondingly, the first light host 640a has an inner gap G2 in the direction of the X-axis smaller than an inner gap G3 of the second light host 640b. The difference between the inner gap G2 and the inner gap G3 may be smaller than or equal to 200 nm.

For example, the first unit 600a may be a blue unit while the second unit 600b may be a red unit, or vice versa. In this case, the maximum width difference or the gap difference between the first light host 640a and the second light host 640b may be in a range of 0 nm to 200 nm. For another example, the first unit 600a may be a green unit while the second unit 600b may be a red or blue unit. In this case, the maximum width W7 of the second light host 540b may be in a range of the maximum width W6±100 nm, and the inner gap G3 of the second light host 540b may be in a range of the inner gap G2±100 nm. Since the green light wavelength is larger than the blue light wavelength and smaller than the red light wavelength, the green unit may be used as the reference unit for the structure of the light hosts to minimize the deviation between the units.

Figure 9:
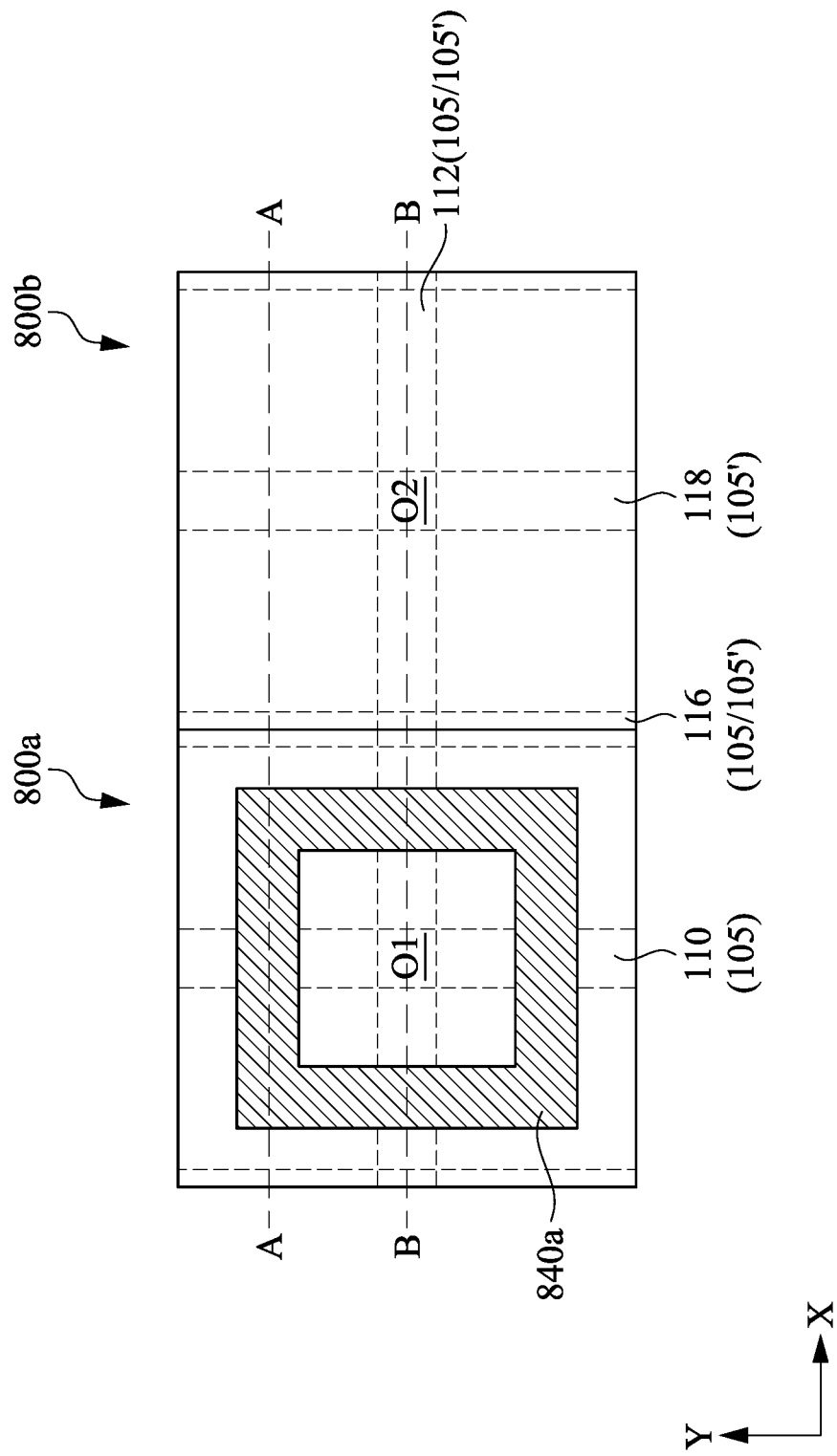
FIG. 9 illustrates a top scheme view of a light sensing element according to another embodiment of the present disclosure.

In some embodiments, not all units in the light sensing element are necessary to include the light host above the photodiodes. According to one embodiment of the present disclosure, FIG. 9 illustrates a top scheme view of a light sensing element 80. The light sensing element 80 is similar to the light sensing element 40 in FIG. 6A, except for the presence of the first light host 840a in the first unit 800a and the absence of the second light host in the second unit 800b.

Figure 10A:
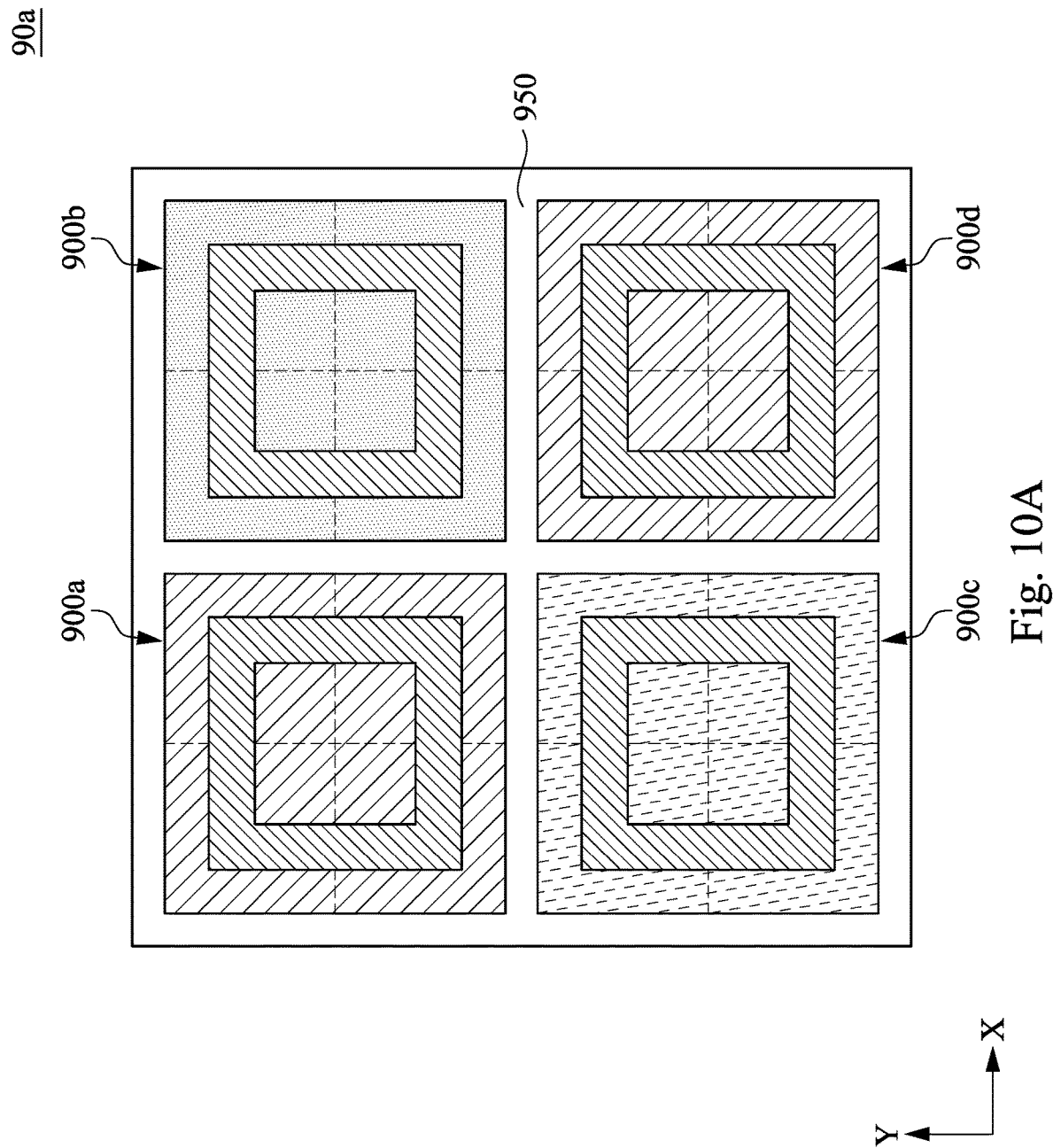
FIGS. 10A and 10B illustrate the top scheme views of the light sensing elements according to some embodiments of the present disclosure.

According to one embodiment of the present disclosure, FIG. 10A illustrates a top scheme view of a light sensing element 90a. The light sensing element 90a includes a first unit 900a, a second unit 900b, a third unit 900c, and a fourth unit 900d. The dash line represents the intersected deep trench isolation structure (for example, the deep trench isolation structure 105 in FIG. 1A) in each unit. As shown in FIG. 10A, the units 900a to 900d may be assembled by the grid 950 to form the light sensing element 90a.

Any adjacent two of the first unit 900a, the second unit 900b, the third unit 900c, and the fourth unit 900d may have different color filters. For example, the applied color filters may provide the combination of units 900a to 900d as red-green-blue (RGB), red-green-blue-clear (RGBC), red-yellow-yellow-blue (RYYB), cyan-magenta-yellow (CMY) or the like. In some embodiments, the unit arrangement shown in FIG. 10A may also be considered as 4C scheme herein since there are four units 900a to 900d in the light sensing element 90a.

Figure 10B:
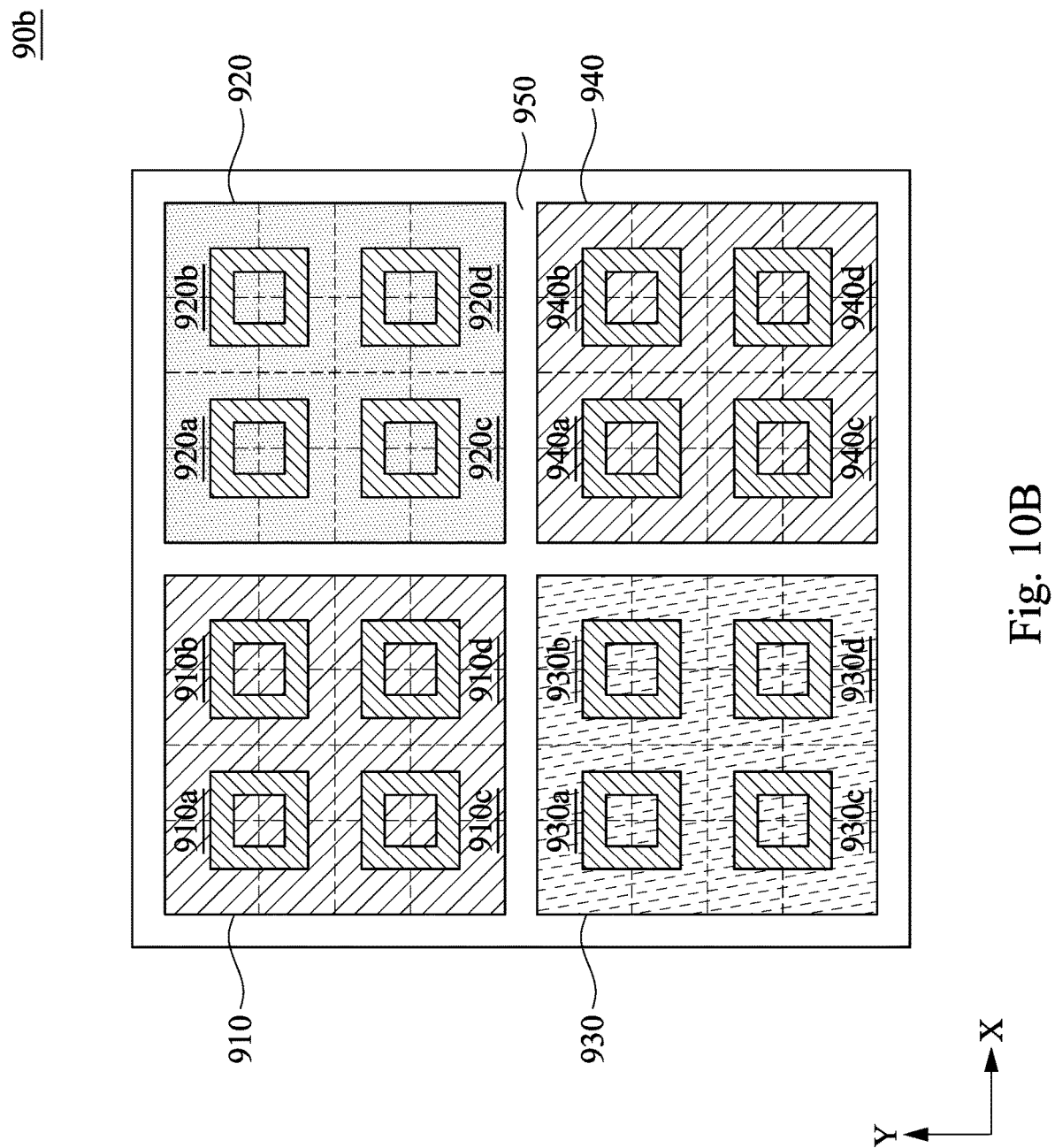

In some embodiments, multiple units 100 may be included in a region of the light sensing element, while the units 100 in the region are arranged as a two-dimensional array with n columns and n rows, and n is an integer. According to one embodiment of the present disclosure, FIG. 10B illustrates a top scheme view of a light sensing element 90b. The light sensing element 90b includes a first region 910 with units 910a to 910d, a second region 920 with units 920a to 920d, a third region 930 with units 930a to 930d, and a fourth region 940 with units 940a to 940d. The dash line represents the intersected deep trench isolation structure (for example, the deep trench isolation structure 105 in FIG. 1A) in each unit. As shown in FIG. 10B, the regions 910 to 940 may be assembled by the grid 950 to form the light sensing element 90a, and each of the regions 910 to 940 has 2 columns and 2 rows of units.

Any adjacent two of the regions 910 to 940 may have different color filters, while the units in each one of the regions 910 to 940 have the same color filter. For example, the applied color filters may provide the combination of regions 910 to 940 as red-green-blue (RGB), red-green-blue-clear (RGBC), red-yellow-yellow-blue (RYYB), cyan-magenta-yellow (CMY) or the like. In some embodiments, the unit arrangement shown in FIG. 10B may also be considered as 16C scheme (i.e., $4n^2$ scheme for n equals 2) herein since there are sixteen units in the light sensing element 90b.

According to the above-mentioned embodiments, the light sensing element of the present disclosure includes the unit having the light host embedded in the color filter. The light host has the hollow structure above the photodiodes, so that the light host uniformly redistributes the light to the photodiodes after refracting the incident light. Therefore, the light redistribution by the light host provides a uniform light distribution for photodiodes in one unit, which improves the accuracy of the light sensing element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A light sensing element, comprising:
   a plurality of first units, each of the plurality of the first units comprising:
   a plurality of first photodiodes;
   a first color filter disposed above the plurality of the first photodiodes; and
   a first light host embedded in the first color filter,
   wherein the first light host is a hollow structure disposed above the plurality of the first photodiodes,
   wherein the first color filter comprises:
   a first portion surrounding the first light host;
   a second portion surrounded by the first light host; and
   a third portion covering and physically contacting the first portion, the first light host, and the second portion.

2. The light sensing element of claim 1, wherein a refractive index of the first light host is higher than that of the first color filter, and wherein the refractive index of the first light host is in a range of 1.8 to 2.5.

3. The light sensing element of claim 1, wherein a maximum height of the first light host is in a range of 100 nm to 900 nm.

4. The light sensing element of claim 1, wherein a maximum width of the first light host is in a range of 50 nm to 500 nm.

5. The light sensing element of claim 1, wherein a difference between a top width and a bottom width of the first light host is smaller than or equal to 500 nm.

6. The light sensing element of claim 1, wherein an inner gap between inner sidewalls of the first light host is in a range of 100 nm to 500 nm.

7. The light sensing element of claim 1, wherein the second portion of the first color filter has a circle shape, a square shape, a hexagon shape, or an octagon shape in a plan view, and wherein the first light host conformally surrounds the second portion.

8. The light sensing element of claim 1, wherein the first light host has a square cross-section, a rectangle cross-section, a triangle cross-section, or a trapezoid cross-section.

9. The light sensing element of claim 1, wherein each of the plurality of the first units further comprises a deep trench isolation structure separating the plurality of the first photodiodes, the deep trench isolation structure comprises a first deep trench isolation portion extending through a center of the first unit and a second deep trench isolation portion extending along an edge of the first unit, and
wherein a pixel size is defined as a distance between a center line of the first deep trench isolation portion and a center line of the second deep trench isolation portion, and a maximum width of the first light host is smaller than or equal to ½ of the pixel size.

10. The light sensing element of claim 9, wherein an inner gap between inner sidewalls of the first light host is smaller than or equal to ½ of the pixel size.

11. The light sensing element of claim 1, wherein the first light host is symmetric distributed relative to a center of the first unit.

12. The light sensing element of claim 1, further comprising:
a second unit adjacent to one of the plurality of the first units, comprising:
a plurality of second photodiodes; and
a second color filter disposed above the plurality of the second photodiodes.

13. The light sensing element of claim 12, wherein the second unit further comprises a second light host embedded in the second color filter, the second light host is a hollow structure disposed above the plurality of the second photodiodes, and the second color filter comprises:
a fourth portion surrounding the second light host;
a fifth portion surrounded by the second light host; and
a sixth portion covering and physically contacting the fourth portion, the second light host, and the fifth portion.

14. The light sensing element of claim 13, wherein the first light host has a first maximum height, the second light host has a second maximum height, and a difference between the second maximum height and the first maximum height is smaller than or equal to 400 nm.

15. The light sensing element of claim 13, wherein the first light host has a first maximum width, the second light host has a second maximum width, and a difference between the second maximum width and the first maximum width is smaller than or equal to than 200 nm.

16. The light sensing element of claim 13, wherein the first light host has a first inner gap, the second light host has a second inner gap, and a difference between the second inner gap and the first inner gap is smaller than or equal to 200 nm.

17. The light sensing element of claim 12, further comprising:
a third unit adjacent to the one of the plurality of the first units; and
a fourth unit adjacent to the third unit and the second unit,
wherein any adjacent two of the first unit, the second unit, the third unit, and the fourth unit have different color filters.

18. The light sensing element of claim 1, wherein the plurality of the first units are disposed in one of four regions of the light sensing element, the plurality of the first units are arranged as a two-dimensional array with n columns and n rows, and n is an integer, and wherein any adjacent two of the four regions have different color filters.

19. The light sensing element of claim 1, wherein the plurality of the first photodiodes are arranged in a 2×2 array.

20. The light sensing element of claim 1, further comprising:
a lens above the first color filter, wherein a center of the lens is offset from a center of one of the plurality of the first units.

* * * * *